United States Patent
Lim

(10) Patent No.: US 9,412,784 B1
(45) Date of Patent: Aug. 9, 2016

(54) PRE-FLASH TIME ADJUSTING CIRCUIT AND IMAGE SENSOR USING THE SAME

(71) Applicant: PixArt Imaging (Penang) SDN. BHD., Penang (MY)

(72) Inventor: Wooi-Kip Lim, Penang (MY)

(73) Assignee: PIXART IMAGING (PENANG) SDN. BHD., Penang (MY)

( * ) Notice: Subject to any disclaimer, the term of this patent is extended or adjusted under 35 U.S.C. 154(b) by 0 days.

(21) Appl. No.: 14/873,607

(22) Filed: Oct. 2, 2015

(51) Int. Cl.
*H01L 27/144* (2006.01)
*G06F 3/0354* (2013.01)
*H01L 27/146* (2006.01)

(52) U.S. Cl.
CPC ...... *H01L 27/14681* (2013.01); *G06F 3/03543* (2013.01)

(58) Field of Classification Search
CPC ............ H01L 27/144; H01L 27/14681; G06F 3/0304; G06F 3/03543
See application file for complete search history.

(56) References Cited

U.S. PATENT DOCUMENTS

| | | | | |
|---|---|---|---|---|
| 2001/0054744 A1* | 12/2001 | Scott-Thomas | ...... | H04N 3/1512 257/443 |
| 2005/0253812 A1* | 11/2005 | Lin | ...... | G06F 3/03543 345/163 |
| 2011/0291924 A1* | 12/2011 | Raynor | ...... | G06F 3/03543 345/157 |
| 2013/0241442 A1* | 9/2013 | Trattler | ...... | G03B 7/26 315/307 |
| 2015/0042566 A1* | 2/2015 | Lim | ...... | H01L 27/14681 345/166 |

* cited by examiner

*Primary Examiner* — W B Perkey
(74) *Attorney, Agent, or Firm* — Li & Cai Intellectual Property (USA) Office

(57) ABSTRACT

The present disclosure illustrates a pre-flash time adjusting circuit. The pre-flash time adjusting circuit comprises a first pre-flash time adjusting unit coupled to an image sensing array. The image sensing array comprises a plurality of pixel units. The first pre-flash time adjusting unit comprises a switching module and a storage capacitor. When the image sensing array senses a light beam, the switching module selectively connects a first switch and the storage capacitor, such that the storage capacitor starts to charge the first pixel units of the first pixel group, until base-emitter voltages of a plurality of bipolar junction transistors disposed in the first pixel units reaches a stable state.

20 Claims, 7 Drawing Sheets

PRE-FLASH TIME ADJUSTING CIRCUIT AND IMAGE SENSOR USING THE SAME

BACKGROUND

1. Technical Field

The present disclosure relates to a pre-flash time adjusting circuit, in particular, to a pre-flash time adjusting circuit which can adaptively adjust a pre-flash time of the image sensing array and image sensor thereof.

2. Description of Related Art

An optical mouse, typically includes a light source (such as a light-emitting diode) to illuminate a working surface and an image sensor that functions as a miniature digital camera to continually capture images of the illuminated working surface and to determine the speed and direction that the optical mouse is being moved across the surface by comparing sequentially captured frames of image information so as to control the movement of a cursor displayed on a monitor.

The image sensor includes an image sensing array. The image sensing array includes a plurality of pixel units for capturing image of the illuminated working surface. Please refer to FIG. 1 and FIG. 2. FIG. 1 is a schematic diagram illustrating a conventional pixel unit. FIG. 2 is a timing waveform diagram illustrating the operation of the conventional pixel unit.

The pixel unit 15 includes a PMOS transistor MP1, a NMOS transistor MN1, a NMOS transistor MN2, a NMOS transistor MN3, a PMOS transistor MP2, a bipolar junction transistor (hereinafter BJT transistor) Q, a photodetector PD and a capacitor C. The PMOS transistor MP1, the NMOS transistor MN1 and the NMOS transistor MN2 compose a feedback amplifier circuit 150. The NMOS transistor MN3 and the PMOS transistor MP2 compose a shutter circuit 151. The feedback amplifier circuit 150, the shutter circuit 151 and the photodetector PD are respectively coupled to the BJT transistor Q. The capacitor C is coupled to the shutter circuit 151 and the ground. The capacitor C is configured for operatively storing the image data captured by the photodetector PD.

The operation of the pixel unit 15 can be briefly described as follow. At start of each frame, a light-emitting diode (not shown in FIG. 1) provides a light beam to illuminate the working surface, and the working surface reflects the light beam and generates a reflected light beam. The photodetector PD operatively generates a base current IB in responsive to a light intensity of the reflected light. The feedback amplifier circuit 150 begins to build up a base-emitter voltage $V_{BE}$ of the BJT transistor Q to increase the beta of the BJT transistor Q to a stable state e.g., ~30. The beta herein is the ratio between the collector current IC and the base current IB of the BJT transistor Q. When the BJT transistor Q reaches the stable state, the BJT transistor Q operates with a stable beta and generates a stable emitter current IE. Next, the shutter circuit 151 is triggered on by a shutter signal such that the storage capacitor C can be discharged with a stable emitter current IE to capture the image data. Accordingly, when the shutter circuit 151 is triggered on, the voltage across the capacitor C decreases as the capacitor C discharges through BJT transistor Q with the emitter current IE.

The time required from the light-emitting diode turning on (the base-emitter voltage $V_{BE}$ of the BJT transistor Q starts to increase) to the time the BJT transistor Q reaching the stable state is defined as the pre-flash time of the BJT pixel circuit Q. The time required from the shutter circuit being triggered on until the completion of image capturing is defined as an exposure time. In a conventional image sensor, the pre-flash time is set to about 220 microseconds (us), and the exposure time is set to about 10 us.

However, there is a problem in the conventional image sensor. According to brightness of the image data, the pre-flash time required by the pixel unit 15 will be different. In order to achieve high image quality, the darker image data needs enough pre-flash time. In other words, the darker the image data is, the longer the pre-flash time is required. However, the brighter image does not need too long pre-flash time. Because the conventional image sensor fixes the pre-flash time, when the pixel unit 15 captures the brighter image data, the pre-flash time does not end as soon as the base-emitter voltage $V_{BE}$ of the BJT transistor Q reaches the stable state. The light-emitting unit will waste power if the image sensor operates with the fixed pre-flash time.

SUMMARY

An exemplary embodiment of the present disclosure provides a pre-flash time adjusting circuit which comprises a first pre-flash time adjusting unit coupled to an image sensing array. The image sensing array comprises a plurality of pixel units. The first pre-flash time adjusting unit comprises a switching module and a storage capacitor. A first switch of the switching module is coupled to a first pixel group of the image sensing array, and a second switch of the switching module is coupled to a voltage source. A first end of the storage capacitor is coupled to the switching module, and a second end of the storage capacitor is coupled to ground. The first pixel group comprises a plurality of first pixel units of the pixel units. When the image sensing array senses a light beam, the switching module selectively connects the first switch and the storage capacitor, such that the storage capacitor starts to charge the first pixel units of the first pixel group, until base-emitter voltages of a plurality of bipolar junction transistors disposed in the first pixel units reaches a stable state.

An exemplary embodiment of the present disclosure provides an image sensor. The image sensor comprises an image sensing array and a pre-flash time adjusting circuit. The image sensing array comprises a plurality of pixel units. The pre-flash time adjusting circuit comprises a first pre-flash time adjusting unit coupled to the image sensing array. The first pre-flash time adjusting unit comprises a switching module and a storage capacitor. A first switch of the switching module is coupled to a first pixel group of the image sensing array, and a second switch of the switching module is coupled to a voltage source. A first end of the storage capacitor is coupled to a third end of the switching module, and a second end of the storage capacitor is coupled to ground. The first pixel group comprises a plurality of first pixel units of the pixel units. When the image sensing array senses a light beam, the switching module selectively connects the first switch and the storage capacitor, such that the storage capacitor starts to charge the first pixel units of the first pixel group, until base-emitter voltages of a plurality of bipolar junction transistors disposed in the first pixel units reach a stable state.

To sum up, the pre-flash time adjusting circuit and the image sensor provided by the present disclosure can adaptively adjust the pre-flash time of the pixel units of the image sensing array in response to the brightness of the image data associated with the working surface, and adjust working duration of the light-emitting unit disposed in the image sensor. Compared with the conventional image sensor which fixes the pre-flash time, the pre-flash time adjusting circuit and the image sensor provided by the present disclosure reduces power consumption of the light-emitting unit effectively.

In order to further understand the techniques, means and effects of the present disclosure, the following detailed descriptions and appended drawings are hereby referred to, such that, and through which, the purposes, features and aspects of the present disclosure can be thoroughly and concretely appreciated; however, the appended drawings are merely provided for reference and illustration, without any intention to be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTION OF THE EXEMPLARY EMBODIMENTS

Figure 1:
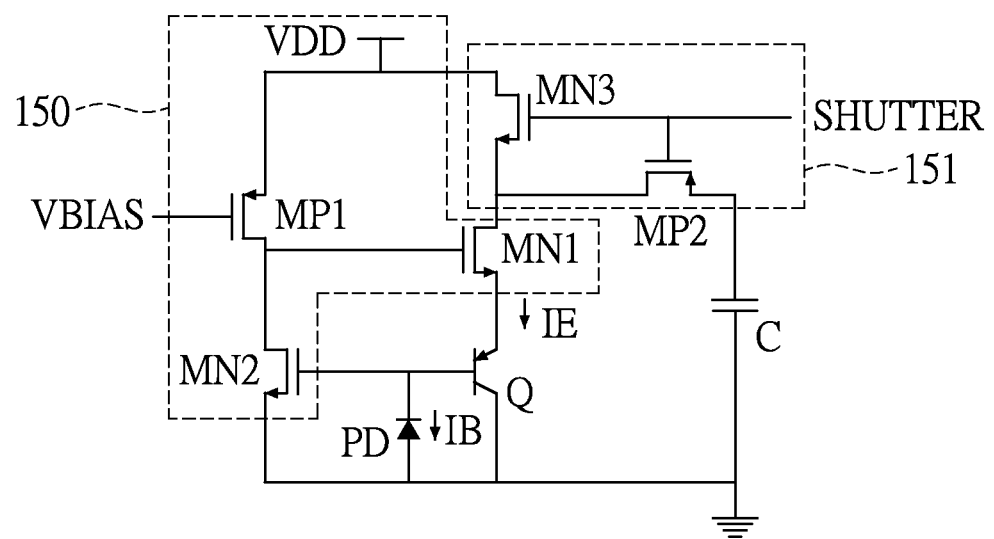
FIG. 1 is schematic diagram illustrating a conventional pixel unit.
Figure 2:
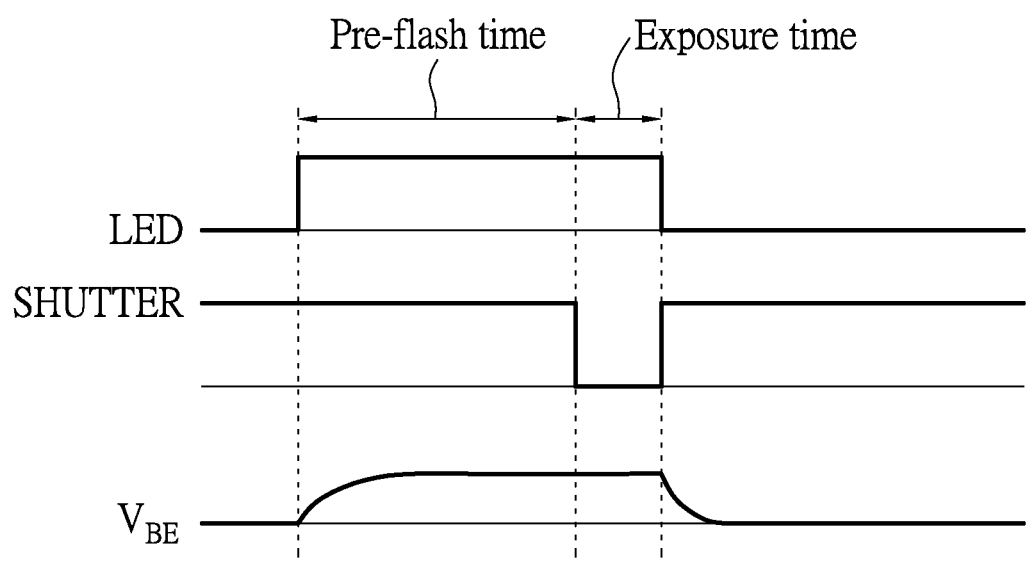
FIG. 2 is a timing waveform diagram illustrating the operation of the conventional pixel unit.

Reference will now be made in detail to the exemplary embodiments of the present disclosure, examples of which are illustrated in the accompanying drawings. Wherever possible, the same reference numbers are used in the drawings and the description to refer to the same or like parts.

Notably, the terms first, second, third, etc., may be used herein to describe various elements or signals, but these signals should not be affected by such elements or terms. Such terminology is used to distinguish one element from another or a signal with another signal. Further, the term "or" as used herein in the case may include any one or combinations of the associated listed items.

Figure 3:
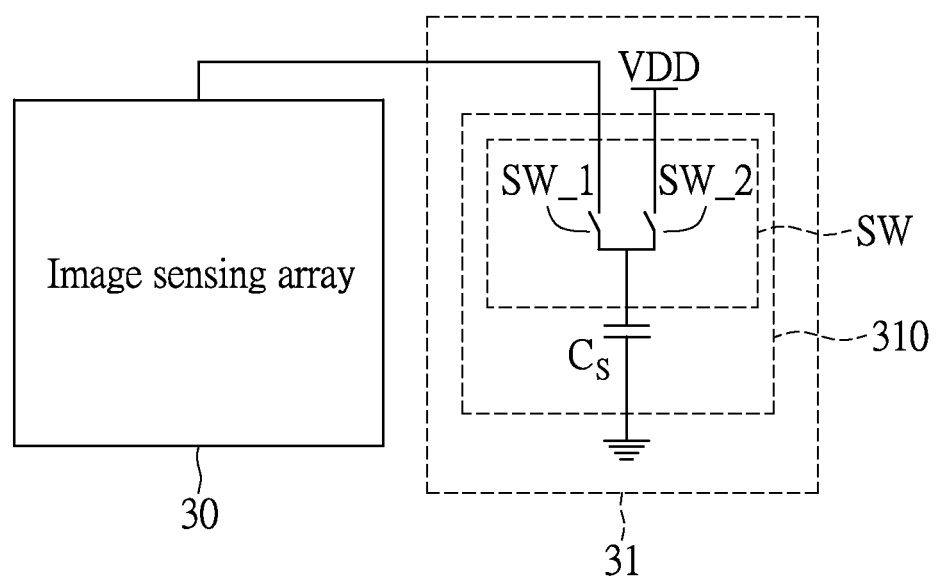
FIG. 3 is a schematic diagram illustrating an image sensor provided in accordance to an exemplary embodiment of the present disclosure.

Please refer to FIG. 3, which shows a schematic diagram illustrating an image sensor provided in accordance to an exemplary embodiment of the present disclosure. The image sensor 3 is used in an optical navigation device (not shown in FIG. 3) which operates on a working surface. The optical navigation device comprises a light-emitting unit LED (not shown in FIG. 3), such as a light-emitting unit diode or a laser diode. The light-emitting unit LED is configured for operatively providing a light beam illuminating the working surface, such that the image sensor 3 can capture image data of the illuminated working surface. In the instant embodiment, the optical navigation device may include but is not limited to an optical mouse, a track pad, or a joystick. The image sensor 3 includes an image sensing array 30 and a pre-flash time adjusting circuit 31. The image sensing array 30 is coupled to the pre-flash time adjusting circuit 31.

The image sensing array 30 includes suitable logic, circuit and/or coding, configured for operatively capturing the image data of the working surface. To put it concretely, the image sensing array 30 includes a plurality of pixel units (not shown in FIG. 3) forming at least one pixel group. The pixel units are configured for operatively receiving a light beam and capturing the image data associated with the working surface. In the exemplary embodiment, the image sensing array 30 includes only one pixel group.

The image sensing array 30 is a complementary metal-oxide semiconductor (CMOS) image sensing array, or a charge-coupled device (CCD) image sensing array. However, the present disclosure is not limited thereto.

The pre-flash time adjusting circuit 31 includes at least one pre-flash time adjusting unit 310. The pre-flash time adjusting unit 310 includes a switching module SW and a storage capacitor $C_S$. A first switch SW_1 of the switching module SW is coupled to the image sensing array 30. A second switch SW_2 of the switching module SW is coupled to a voltage source to receive a supply voltage VDD. The switching module SW is coupled to a first end of the storage capacitor $C_S$. A second end of the storage capacitor $C_S$ is coupled to a ground. The switching module SW is configured for selectively connecting the first switch SW_1 and the storage capacitor $C_S$, or selectively connecting the second switch SW_2 and the storage capacitor $C_S$.

The pre-flash time adjusting circuit 31 adaptively adjusts a pre-flash time of the image sensing array 30, such that the image sensing array 30 captures the corresponding image data. By disposing the pre-flash time adjusting circuit 31 in the image sensing array 30, the light-emitting unit LED can reduce power consumption.

Figure 4:
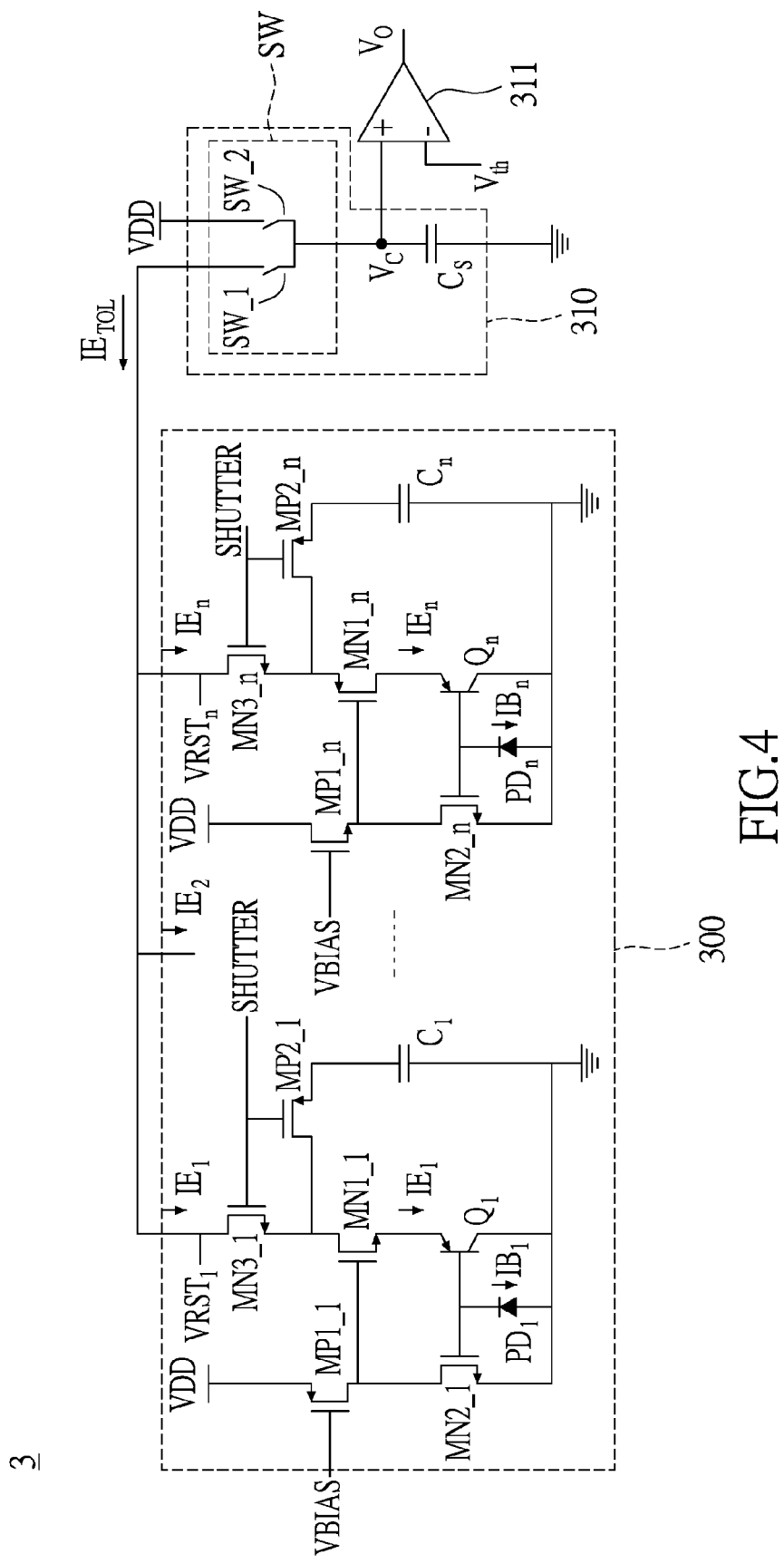
FIG. 4 is a circuit diagram illustrating the image sensor provided in accordance to an exemplary embodiment of the present disclosure.

To explain a structure and an operation of the image sensor 3, please refer to FIG. 4, which shows a circuit diagram illustrating the image sensor provided in accordance to an exemplary embodiment of the present disclosure. As described above, the image sensor 3 comprises an image sensing array 30 and a pre-flash time adjusting circuit 31. The image sensing array 30 comprises a pixel group 300 which includes N pixel units connected in parallel, wherein N is a positive integer greater than 1.

A first pixel unit of the pixel units includes a PMOS transistor MP1_1, a NMOS transistor MN1_1, a NMOS transistor MN2_1, a NMOS transistor MN3_1, a PMOS transistor MP2_1, a BJT transistor $Q_1$, a photodetector $PD_1$ and a first capacitor $C_1$. The BJT transistor $Q_1$ in the instant embodiment is a PNP bipolar junction transistor. The PMOS transistor MP1_1, the NMOS transistor MN1_1 and the NMOS transistor MN2_1 compose a feedback amplifier circuit. The NMOS transistor MN3_1 and PMOS transistor MP2_1 compose a shutter circuit.

A source of the PMOS transistor MP1_1 is coupled to the voltage source to receive the supply voltage VDD. A gate of the PMOS transistor MP1_1 is coupled to a bias end to receive a bias voltage VBIAS. A drain of the PMOS transistor MP1_1 is coupled to a drain of the NMOS transistor MN2_1. A gate of the NMOS transistor MN2_1 is coupled to a base of the BJT transistor $Q_1$. A source of the NMOS transistor MN2_1 is coupled to the ground. A gate of the NMOS transistor MN1_1 is coupled to a drain of the PMOS transistor MP1_1. A drain of the NMOS transistor MN1_1 is coupled to a source of the NMOS transistor MN3_1. A source of the NMOS transistor MN1_1 is coupled to an emitter of the BJT transistor $Q_1$.

A drain of the NMOS transistor MN3_1 is coupled to a control end to receive a control voltage $VRST_1$. Moreover, the drain of the NMOS transistor MN3_1 is further coupled to the first switch SW_1 of the switching module SW. A gate of the NMOS transistor MN3_1 is coupled to a gate of the PMOS transistor MP2_1. The drain of the PMOS transistor MP2_1 is coupled to a source of the NMOS transistor MN3_1. A gate of the PMOS transistor MP2_1 is coupled to a shutter end to receive a shutter signal SHUTTER. A source of the PMOS transistor MP2_1 is coupled to a first end of the first capacitor $C_1$. A collector of the BJT transistor $Q_1$ and a second end of the first capacitor $C_1$ are coupled to the ground. Additionally, a control circuit (not shown in FIG. 4) is respectively coupled to the bias end, the control end, and the shutter end to control the operation of the image sensing array 30.

A cathode of the photodetector $PD_1$ is coupled to a base of the BJT transistor $Q_1$. An anode of the photodetector $PD_1$ is coupled to the ground. The cathode of the photodetector $PD_1$ is further coupled to the base of the BJT transistor $Q_1$. In other words, the photodetector $PD_1$ is coupled between the base of the BJT transistor $Q_1$ and the ground. The photodetector $PD_1$ may be implemented by a photodiode, however in practice, the photodetector $PD_1$ may be any light sensing element or circuit that transforms light intensity into a voltage value and the present disclosure is not limited thereto.

Structures of other pixel units included in the pixel group 300 are similar to the first pixel unit, thus their description is omitted. Incidentally, the structures of the pixel units described above are not limited to the examples provided by the instant embodiment. The pixel units may be any circuits that can capture the image data and the present disclosure is not limited thereto.

The pre-flash time adjusting circuit 31 comprises a pre-flash time adjusting unit 310 and a comparator 311. The structure and the connection of the pre-flash time adjusting unit 310 are as described previously. A non-inverting input end of the comparator 311 is coupled to the first end of the storage capacitor $C_S$, and an inverting input end of the comparator 311 receives a threshold voltage $V_{TH}$.

At the start of each frame, the first switch SW_1 of the switching module SW connects to the storage capacitor $C_S$, and the storage capacitor $C_S$ starts providing a charge current $IE_{TOL}$ to the pixel units. A current value of the charge current $IE_{TOL}$ is associated with emitter currents of the BJT transistors $Q_1 \ldots Q_n$ of the pixel units. In a mathematical formula, the charge current $IE_{TOL}=IE_1+IE_2+\ldots IE_n$, wherein $IE_1$ is the emitter current of the BJT transistors $Q_1$, $IE_2$ is the emitter current of the BJT transistors $Q_2$, and $IE_n$ is the emitter current of the BJT transistors $Q_n$.

Figure 5:
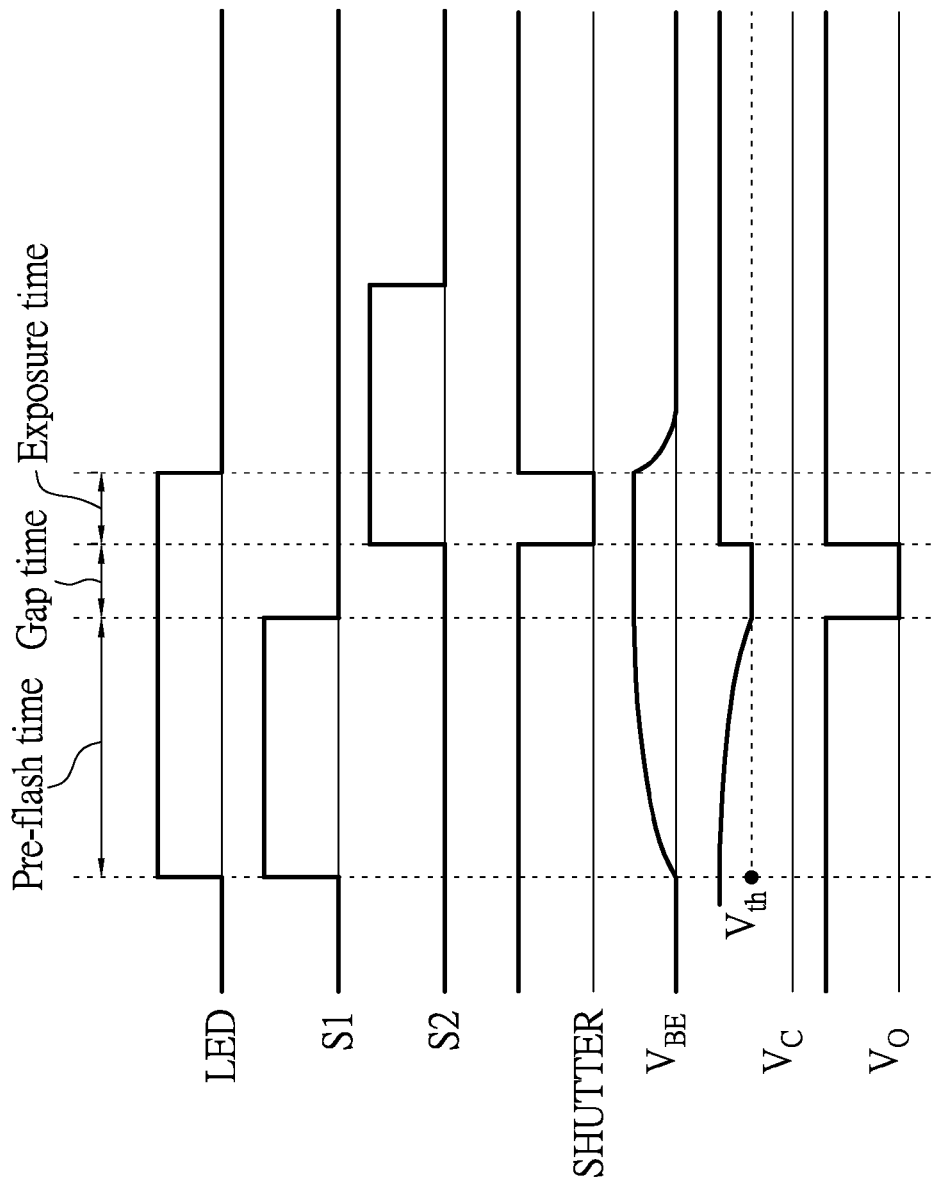
FIG. 5 is a timing waveform diagram illustrating the operation of the image sensor.

To explain the operation of the image sensor 3, please refer to FIG. 5, which shows a timing waveform diagram illustrating the operation of the image sensor. At the start of each frame, the control circuit turns on the light-emitting unit LED to illuminate the working surface of the optical navigation device. Meanwhile, the photodetector $PD_1$ operatively generates a base current $IB_1$ based on the light intensity of a reflected light beam incident on the photodetector $PD_1$, wherein the reflected light beam is the light reflected from the working surface illuminated by the light-emitting unit LED.

The control circuit outputs a first switching signal S1 with a logic high level to the switching module SW, such that the switching module SW connects the first switch SW_1 and the storage capacitor $C_S$. At this time, the second switch SW_2 and storage capacitor $C_S$ are electrically isolated.

Next, the storage capacitor $C_S$ starts providing the charge current $IE_{TOL}$ to charge the pixel units. For the first pixel unit, the PMOS transistor MP1_1, the NMOS transistor MN1_1 and the NMOS transistor MN2_1 of the first pixel unit continues to operatively increase the base-emitter voltage $V_{BE}$ of the BJT transistor $Q_1$ so as to increase the beta of the BJT transistor $Q_1$ to a stable state (e.g., ~30) after the first pixel unit receives the charge current $IE_{TOL}$ through the NMOS transistor MN3_1. The beta herein is the ratio between the collector current $IC_1$ and the base current $IB_1$ of the BJT transistor $Q_1$. When the BJT transistor $Q_1$ reaches the stable state, the BJT transistor $Q_1$ operates with a stable base-emitter voltage $V_{BE}$ and generates a stable emitter current $IE_1$.

Similarly, the base-emitter voltages $V_{BE}$ of the BJT transistor $Q_2$-$Q_n$ disposed in the second pixel unit to the N-th pixel unit respectively increase to reach the stable state. The pre-flash time is defined as a period from when the base-emitter voltages $V_{BE}$ of the BJT transistors disposed in the pixel units begin to rise until the stable state.

Electric charge quantity stored in the storage capacitor $C_S$ decreases along with time because the storage capacitor $C_S$ continues to operatively provide the charge current $IE_{TOL}$ to the pixel units, which means that a voltage level $V_C$ of the first end of the storage capacitor $C_S$ will decrease along with time. In other words, the voltage level $V_C$ of the first end of the storage capacitor $C_S$ is associated with the base-emitter voltages $V_{BE}$ of the pixel units. Before the voltage level $V_C$ of the first end of the storage capacitor $C_S$ is less than a threshold voltage $V_{TH}$, the comparator 311 outputs a comparative signal $V_o$ with a logic high level to the control circuit.

Until all of the base-emitter voltages $V_{BE}$ of the pixel units reach the stable state, the voltage level $V_C$ of the first end of the storage capacitor $C_S$ is less than a threshold voltage $V_{TH}$. Then, the comparator 311 outputs the comparative signal $V_o$ with a logic low level to the control circuit.

After sensing the logic level of the comparative signal $V_o$ changes from high to low, the control circuit outputs the first switching signal S1 with a logic low level to the switching module SW. The switching module SW electrically isolates the first switch SW_1 and the storage capacitor $C_S$ to finish the pre-flash time of the pixel units. Moreover, the control circuit outputs a second switching signal S2 with a logic high level to the switching module SW. The switching module SW connects the second switch SW_2 and the storage capacitor $C_S$, and then the voltage level $V_C$ of the first end of the storage capacitor $C_S$ is reset to an initial voltage.

On the other hand, the control circuit outputs shutter signals SHUTTER with logic low level to the shutter ends of each pixel unit to begin the exposure time of the photodetectors $PD_1 \ldots PD_n$. The PMOS transistors MP2_1 ... MP2_n are turning on and the NMOS transistors MN3_1 ... MN3_n are turning off During the exposure time, the first capacitor $C_1$ to the n-th capacitor $C_n$ of the pixel units stably discharge through the BJT transistor $Q_1 \ldots Q_n$ with the emitter current $IE_1 \ldots IE_n$. Then, the pixel units capture the image data associated with the working surface.

In FIG. 5, there is a gap time between the pre-flash time and the exposure time. During the gap time, the control circuit receives the comparative signal $V_o$ outputted by the comparator 311, and then outputs the first switching signal S1, the second switching signal S2 and the shutter signal SHUTTER in response to the comparative signal $V_o$. The present disclosure does not limit the duration of the gap time. In the current exemplary embodiment, the gap time is close to zero.

In summary, the pre-flash time adjusting circuit 31 provided by the present disclosure can adaptively adjust the pre-flash time of the pixel units based upon the brightness of the image data. The darker the image data is, the more the pre-flash time adjusting circuit 31 increases the pre-flash time through the switching module SW. On the contrary, The brighter the image data is, the more the pre-flash time adjusting circuit 31 decreases the pre-flash time through the switching module SW. Accordingly, the light-emitting unit LED stops providing the light beam after the base-emitter voltages $V_{BE}$ of the BJT transistors $Q_1 \ldots Q_n$ reach the stable state to save power.

For instance, when the image sensing array 30 captures the brighter image data, the BJT transistors $Q_1 \ldots Q_n$ may need only 30 us to reach the stable state. Then, the light-emitting unit LED turns on for 30 us to provide the light beam. Compared with the conventional image sensor which sets a fixed pre-flash time (e.g., 220 us), the image sensor 3 provided by the present disclosure can save 86% of the power consumed by the light-emitting unit LED.

Incidentally, duration of the exposure time is associated with duration of the pre-flash time, which means that the duration of the exposure time will vary in response to the brightness of the image data. The longer the pre-flash time is, the longer the exposure time needed for the pixel units to capture the image data.

When one of the pixel units (such as the N-th pixel unit) is damaged and unable to accurately capture the image data, the control circuit stops providing current to the N-th pixel unit to save power.

Figure 6:
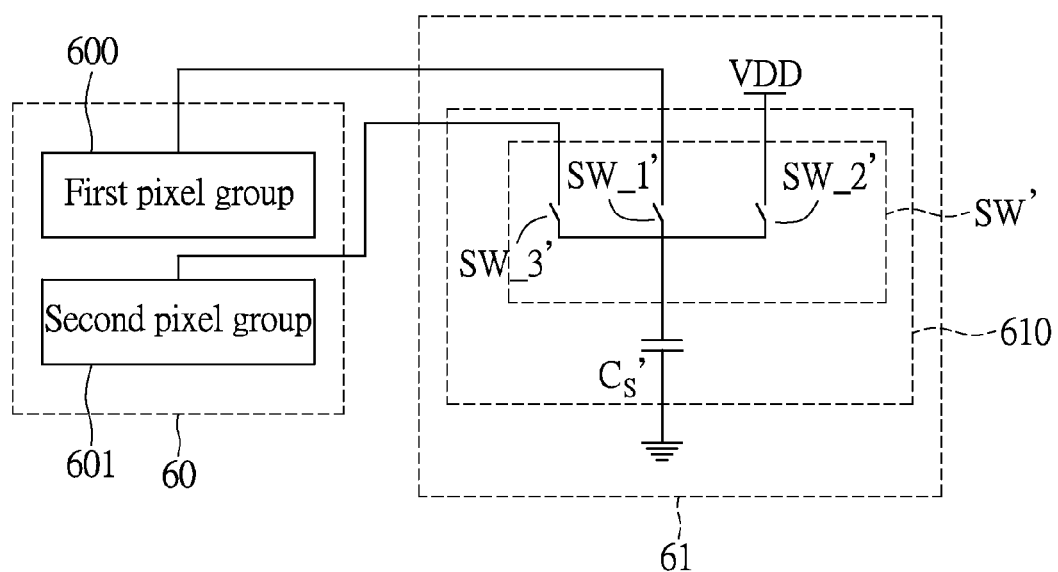
FIG. 6 is a schematic diagram illustrating an image sensor provided in accordance to another exemplary embodiment of the present disclosure.

Please refer to FIG. 6, which shows a schematic diagram illustrating an image sensor provided in accordance to another exemplary embodiment of the present disclosure. A structure of the image sensor 6 shown in FIG. 6 is similar to the image sensor 3 shown in FIG. 3, and therefore only differences between them will be described below.

The image sensor 6 also comprises an image sensing array 60 and a pre-flash time adjusting circuit 61. Differences between the image sensor 3 and the image sensor 6 are that, a switching module SW' of a pre-flash time adjusting unit 610 of the pre-flash time adjusting circuit 61 further comprises a third switch SW_3' besides a first switch SW_1' and a second switch SW_2'. Furthermore, the image sensing array 60 is divided into a first pixel group 600 and a second pixel group 601. The first pixel group 600 and the second pixel group 601 respectively include a plurality of pixel units.

The first switch SW_1' of the switching module SW' is coupled to the first pixel group 600. The second switch SW_2' of the switching module SW' is coupled to a voltage source to receive a supply voltage VDD. The switching module SW' is coupled to a first end of the storage capacitor $C_S'$. A second end of the storage capacitor $C_S'$ is coupled to a ground. The third switch SW_3' of the switching module SW' is coupled to the second pixel group 601.

Operation of the pre-flash time adjusting circuit 61 is similar to the pre-flash time adjusting circuit 31 described above. When the image sensor 6 wants to capture an image data through the first pixel group 600, a control circuit (not shown in FIG. 6) outputs a first switching signal S1', such that the switching module SW' connects the first switch SW_1' and the storage capacitor $C_S'$. The storage capacitor $C_S'$ starts providing a charge current to charge the pixel units of the first pixel group 600. The pre-flash time adjusting unit 610 correspondingly adjusts a first pre-flash time of the first pixel group 600 in response to brightness of the image data.

When all of the BJT transistors (not shown in FIG. 6) disposed in the first pixel group 600 reach a stable state, the switching module SW' connects the second switch SW_2' and the storage capacitor $C_S'$, and the first switch SW_1' and the storage capacitor $C_S'$ is electrically isolated. Electric charge quantity stored in the storage capacitor $C_S'$ is reset. Then, the first pixel group 600 begins an exposure time to capture the image data.

Or, when the image sensor 6 wants to capture the image data through the second pixel group 601, the control circuit outputs a third switching signal S3', such that the switching module SW' connects the third switch SW_3' and the storage capacitor $C_S'$. The storage capacitor $C_S'$ starts providing the charge current to charge the pixel units of the second pixel group 601. The pre-flash time adjusting unit 610 correspondingly adjusts a second pre-flash time of the second pixel group 601 in response to brightness of the image data.

The pixel units of the first pixel group 600 are controlled by the first switch SW_1' of the switching module SW', and the pixel units of the second pixel group 601 are controlled by the third switch SW_3' of the switching module SW'. In terms of the switching module SW', the pixel units of the first pixel group 600 have the same first pre-flash time, and the pixel units of the second pixel group 601 have the same second pre-flash time. According to the brightness of the image data, the first pre-flash time may equal to the second pre-flash time, or the first pre-flash time may different to the second pre-flash time.

Depending on the application of the image sensor 6, the pre-flash time adjusting circuit 61 can simultaneously provide the charge current to the first pixel group 600 and the second pixel group 601, or the pre-flash time adjusting circuit 61 can alternately provide the charge current to the first pixel group 600 and the second pixel group 601.

Notably, in the current exemplary embodiment, the image sensing array 60 is divided into two pixel groups. However, the present disclosure is not limited thereto. In another exemplary embodiment, the image sensing array 60 can be divided into M pixel groups, wherein M is a positive integer greater than 1. The switching module SW' increases the number of pins according to the number of the pixel groups to adaptively adjust the pre-flash time of the pixel groups.

Figure 7:
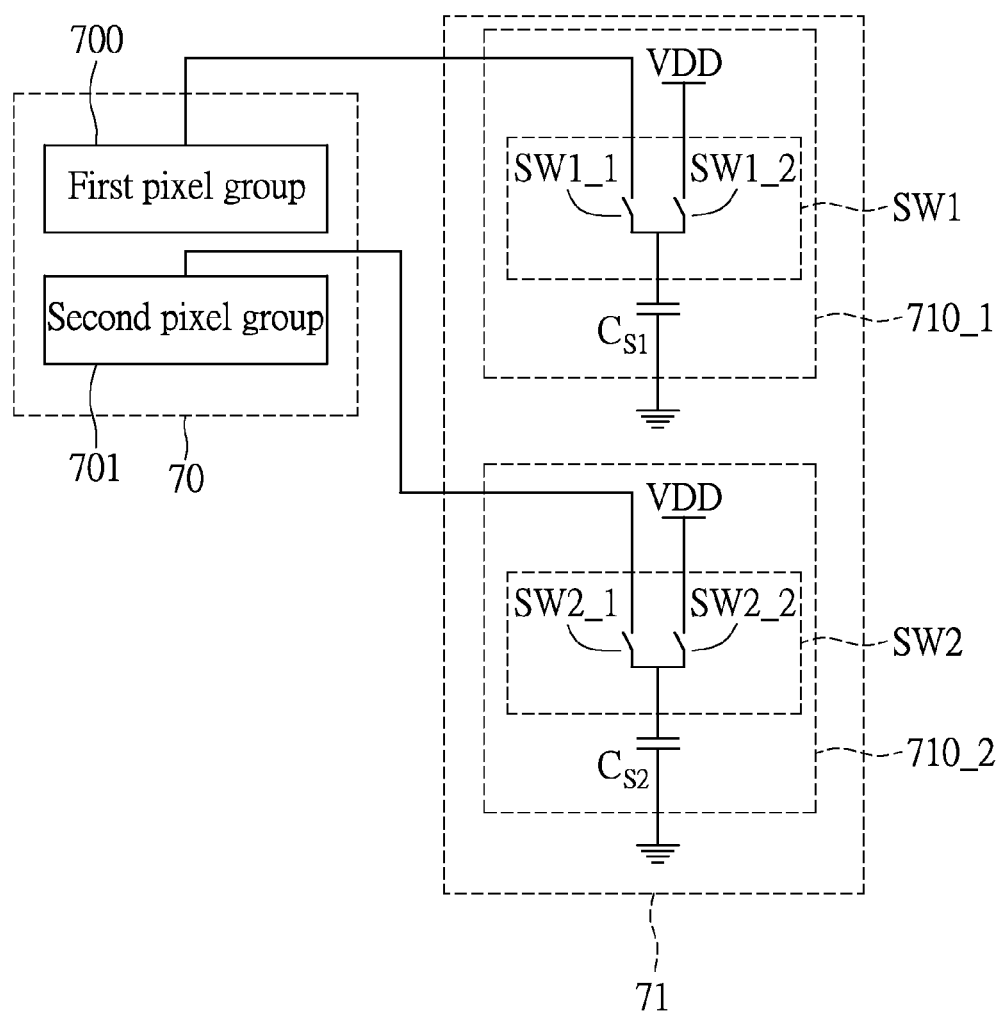
FIG. 7 is a schematic diagram illustrating an image sensor provided in accordance to another exemplary embodiment of the present disclosure.

Please refer to FIG. 7, which shows a schematic diagram illustrating an image sensor provided in accordance to another exemplary embodiment of the present disclosure. A structure of the image sensor 7 shown in FIG. 7 is similar to the image sensor 3 shown in FIG. 3 and the image sensor 6 shown in FIG. 6, and therefore only differences between them will be described below.

The image sensor 7 also comprises an image sensing array 70 and a pre-flash time adjusting circuit 71. The difference between the image sensors 3 and 6 and the image sensor 7 is that, the pre-flash time adjusting circuit 71 includes a first pre-flash time adjusting unit 710_1 and a second pre-flash time adjusting unit 710_2. Furthermore, the image sensing array 70 is divided into a first pixel group 700 and a second pixel group 701. The first pixel group 700 and the second pixel group 701 respectively include a plurality of pixel units.

The first pre-flash time adjusting unit 710_1 includes a switching module SW1 comprising a first switch SW1_1 and second switch SW1_2. The first switch SW1_1 of the switching module SW1 is coupled to the first pixel group 700. The second switch SW1_2 of the switching module SW1 is coupled to a voltage source to receive a supply voltage VDD. The switching module SW1 is coupled to a first end of the storage capacitor $C_{S1}$. A second end of the storage capacitor $C_{S1}$ is coupled to a ground.

Operation of the first pre-flash time adjusting unit 710_1 is similar to the pre-flash time adjusting unit 310 described above, further descriptions are hereby omitted. The pre-flash time adjusting circuit 71 correspondingly adjusts a first pre-flash time of the first pixel group 700 through the first pre-flash time adjusting unit 710_1.

On the other hand, the second pre-flash time adjusting unit 710_2 includes a switching module SW2 comprising a first switch SW2_1 and second switch SW2_2. The first switch SW2_1 of the switching module SW2 is coupled to the second pixel group 701. The second switch SW2_2 of the switching module SW2 is coupled to a voltage source to receive a supply voltage VDD. The switching module SW2 is coupled to a first end of the storage capacitor $C_{S2}$. A second end of the storage capacitor $C_{S2}$ is coupled to the ground.

Operation of the second pre-flash time adjusting unit 710_2 is similar to the pre-flash time adjusting unit 310 described above, further descriptions are hereby omitted. The pre-flash time adjusting circuit 71 correspondingly adjusts a second pre-flash time of the second pixel group 701 through the second pre-flash time adjusting unit 710_2.

The first pre-flash time adjusting unit 710_1 and the second pre-flash time adjusting unit 710_2 are each independent from each other. Depending on the application of the image sensor 7, the pre-flash time adjusting circuit 71 can simultaneously provide a charge current to the first pixel group 700 and the second pixel group 701, or the pre-flash time adjusting circuit 71 can alternately provide the charge current to the first pixel group 700 and the second pixel group 701. Moreover, depending on brightness of an image data captured by the image sensing array 70, the first pre-flash time of the first pixel group 700 may be different from the second pre-flash time of the second pixel group 701, or the first pre-flash time of the first pixel group 700 may equal to the second pre-flash time of the second pixel group 701.

Notably, in the current exemplary embodiment, the pre-flash time adjusting circuit 71 only includes the first pre-flash time adjusting unit 710_1 and the second pre-flash time adjusting unit 710_2. However, the present disclosure is not limited thereto. In another exemplary embodiment, the pre-flash time adjusting circuit 71 can include X pre-flash time adjusting units, wherein X is a positive integer greater than 1. The image sensing array 70 is divided into X pixel groups according to a number of the pre-flash time adjusting units. Hence, the pre-flash time adjusting circuit 71 can adaptively adjust the pre-flash time of the pixel groups.

In summary, the pre-flash time adjusting circuit and the image sensor provided by the present disclosure can adaptively adjust the pre-flash time of the pixel units of the image sensing array in response to the brightness of the image data associated with the working surface, and adjust working duration of the light-emitting unit disposed in the image sensor. Compared with the conventional image sensor which fixes the pre-flash time, the pre-flash time adjusting circuit and the image sensor provided by the present disclosure reduces power consumption of the light-emitting unit effectively.

The above-mentioned descriptions represent merely the exemplary embodiment of the present disclosure, without any intention to limit the scope of the present disclosure thereto. Various equivalent changes, alterations or modifications based on the claims of present disclosure are all consequently viewed as being embraced by the scope of the present disclosure.

What is claimed is:

1. A pre-flash time adjusting circuit which comprises a first pre-flash time adjusting unit coupled to an image sensing array, wherein the image sensing array comprises a plurality of pixel units, and the first pre-flash time adjusting unit comprises:
    a switching module, wherein a first switch of the switching module is coupled to a first pixel group of the image sensing array, and a second switch of the switching module is coupled to a voltage source, wherein the first pixel group comprises a plurality of first pixel units of the pixel units; and
    a storage capacitor, wherein a first end of the storage capacitor is coupled to the switching module, and a second end of the storage capacitor is coupled to a ground;
    wherein when the image sensing array senses a light beam, the switching module selectively connects the first switch and the storage capacitor, such that the storage capacitor starts to charge the first pixel units of the first pixel group, until base-emitter voltages of a plurality of bipolar junction transistors disposed in the first pixel units reaches a stable state.

2. The pre-flash time adjusting circuit according to claim 1, wherein a first pre-flash time is defined as a period from when the base-emitter voltages of the bipolar junction transistors disposed in the first pixel units begin to rise until the stable state.

3. The pre-flash time adjusting circuit according to claim 1, wherein when the switching module selectively connects the first switch and the storage capacitor, the second switch and the storage capacitor is electrically isolated.

4. The pre-flash time adjusting circuit according to claim 1, wherein the first end of the storage capacitor is further coupled to a non-inverting input end of a comparator, and an inverting input end of the comparator receives a threshold voltage, when a voltage level of the first end of the storage capacitor is higher than the threshold voltage, the comparator outputs a comparative signal with a logic high level; wherein the voltage level of the first end of the storage capacitor is associated with the base-emitter voltages of the first pixel units of the first pixel group.

5. The pre-flash time adjusting circuit according to claim 4, wherein electric charge quantity stored in the storage capacitor decreases along with time, such that the voltage level of the first end of the storage capacitor decreases, and then the base-emitter voltages of the first pixel units of the first pixel group increases, until the voltage level of the first end of the storage capacitor is less than the threshold voltage, the comparator outputs the comparative signal with a logic low level to finish the pre-flash time of the first pixel units.

6. The pre-flash time adjusting circuit according to claim 5, wherein when the comparator outputs the comparative signal with the logic low level, a control circuit outputs a switching signal to the pre-flash time adjusting unit, such that the first switch and the storage capacitor is electrically isolated, and the second switch and the storage capacitor is electrically connected, and then the voltage level of the first end of the storage capacitor is reset to an initial voltage.

7. The pre-flash time adjusting circuit according to claim 5, wherein when the comparator outputs the comparative signal with the logic low level, a control circuit outputs a shutter signal to the image sensing array, such that the pixel units captures an image data.

8. The pre-flash time adjusting circuit according to claim 1, wherein the switching module further comprises:
    a third switch, coupled to a second pixel group of the image sensing array, wherein the second pixel group comprises a plurality of second pixel units of the pixel units;
    wherein the pre-flash time adjusting unit selectively connects the storage capacitor and the third switch based upon a switching signal, such that the storage capacitor starts to charge the second pixel units of the second pixel group, until base-emitter voltages of a plurality of bipolar junction transistors disposed in the second pixel units reaches the stable state.

9. The pre-flash time adjusting circuit according to claim 1, further comprising:
   a second pre-flash time adjusting unit, coupled to a second pixel group of the image sensing array, wherein the second pixel group comprises a plurality of second pixel units of the pixel units;
   wherein the first pixel units of the first pixel group have the same first pre-flash time, and the second pixel units of the second pixel group have the same second pre-flash time.

10. The pre-flash time adjusting circuit according to claim 1, wherein the image sensing array is a complementary metal-oxide semiconductor (CMOS) image sensing array, or a charge-coupled device (CCD) image sensing array.

11. An image sensor, comprising:
   an image sensing array, comprising a plurality of pixel units; and
   a pre-flash time adjusting circuit, comprising a first pre-flash time adjusting unit coupled to the image sensing array, wherein the first pre-flash time adjusting unit comprises:
      a switching module, wherein a first switch of the switching module is coupled to a first pixel group of the image sensing array, and a second switch of the switching module is coupled to a voltage source, wherein the first pixel group comprises a plurality of first pixel units of the pixel units; and
      a storage capacitor, wherein a first end of the storage capacitor is coupled to the switching module, and a second end of the storage capacitor is coupled to a ground;
      wherein when the image sensing array senses a light beam, the switching module selectively connects the first switch and the storage capacitor, such that the storage capacitor starts to charge the first pixel units of the first pixel group, until base-emitter voltages of a plurality of bipolar junction transistors disposed in the first pixel units reaches a stable state.

12. The image sensor according to claim 11, wherein a first pre-flash time is defined as a period from when the base-emitter voltages of the bipolar junction transistors disposed in the first pixel units begin to rise until the stable state.

13. The image sensor according to claim 11, wherein when switching module selectively connects the first switch and the storage capacitor, the second switch and the storage capacitor is electrically isolated.

14. The image sensor according to claim 11, wherein the first end of the storage capacitor is further coupled to a non-inverting input end of a comparator, and an inverting input end of the comparator receives a threshold voltage, when a voltage level of the first end of the storage capacitor is higher than the threshold voltage, the comparator outputs a comparative signal with a logic high level; wherein the voltage level of the first end of the storage capacitor is associated with the base-emitter voltages of the first pixel units of the first pixel group.

15. The image sensor according to claim 14, wherein electric charge quantity stored in the storage capacitor decreases along with time, such that the voltage level of the first end of the storage capacitor decreases, and then the base-emitter voltages of the first pixel units of the first pixel group increases, until the voltage level of the first end of the storage capacitor is less than the threshold voltage, the comparator outputs the comparative signal with a logic low level to finish pre-flash of the first pixel units.

16. The image sensor according to claim 15, wherein when the comparator outputs the comparative signal with the logic low level, a control circuit outputs a switching signal to the pre-flash time adjusting unit, such that the first switch and the storage capacitor is electrically isolated, and the second switch and the storage capacitor is connected, and then the voltage level of the first end of the storage capacitor is reset to an initial voltage.

17. The image sensor according to claim 15, wherein when the comparator outputs the comparative signal with the logic low level, a control circuit outputs a shutter signal to the image sensing array, such that the pixel units captures an image data.

18. The image sensor according to claim 11, wherein the switching module further comprises:
   a third switch, coupled to a second pixel group of the image sensing array, wherein the second pixel group comprises a plurality of second pixel units of the pixel units;
   wherein the pre-flash time adjusting unit selectively connects the storage capacitor and the third switch based upon a switching signal, such that the storage capacitor starts to charge the second pixel units of the second pixel group, until base-emitter voltages of a plurality of bipolar junction transistors disposed in the second pixel units reaches the stable state.

19. The image sensor according to claim 11, wherein the pre-flash time adjusting circuit further comprises:
   a second pre-flash time adjusting unit, coupled to a second pixel group of the image sensing array, wherein the second pixel group comprises a plurality of second pixel units of the pixel units;
   wherein the first pixel units of the first pixel group have the same first pre-flash time, and the second pixel units of the second pixel group have the same second pre-flash time.

20. The image sensor according to claim 11, wherein the image sensing array is a complementary metal-oxide semiconductor (CMOS) image sensing array, or a charge-coupled device (CCD) image sensing array.

* * * * *